United States Patent [19]
Fraas et al.

[11] 4,095,004
[45] June 13, 1978

[54] PROCESS FOR LOW TEMPERATURE STOICHIOMETRIC RECRYSTALLIZATION OF COMPOUND SEMICONDUCTOR FILMS

[75] Inventors: Lewis M. Fraas, Malibu; William P. Bleha, Jr., Pacific Palisades, both of Calif.

[73] Assignee: Hughes Aircraft Company, Culver City, Calif.

[21] Appl. No.: 783,257

[22] Filed: Mar. 31, 1977

Related U.S. Application Data

[63] Continuation-in-part of Ser. No. 563,890, Mar. 31, 1975, abandoned.

[51] Int. Cl.² ................... H01L 21/363; H01L 21/203
[52] U.S. Cl. ........................................ 427/74; 148/6.3; 156/610; 156/613; 156/614; 156/DIG. 70; 427/76; 427/87; 427/124; 427/248 A; 427/248 E; 427/255; 427/377; 427/378; 427/380; 427/374 R
[58] Field of Search .................. 427/74, 87, 255, 343, 427/377, 372 R, 374 R, 380, 248 E, 248 A, 378, 76, 124; 156/613, 614, 610, DIG. 70; 148/6.3

[56] References Cited

U.S. PATENT DOCUMENTS

| | | | |
|---|---|---|---|
| 3,391,021 | 7/1968 | Esbitt et al. | 427/74 |
| 3,398,021 | 8/1968 | Lehrer et al. | 427/74 |
| 3,992,233 | 11/1976 | Farrow | 427/87 |
| 4,034,127 | 7/1977 | Busanovich et al. | 427/76 |

FOREIGN PATENT DOCUMENTS

2,141,212  2/1972  Germany ............................ 156/610

Primary Examiner—Ralph S. Kendall
Assistant Examiner—John D. Smith
Attorney, Agent, or Firm—Booker T. Hogan, Jr.; W. H. MacAllister

[57] ABSTRACT

A new, useful and nonobvious process is disclosed wherein vapor phase controlled stoichiometry is employed to obtain compound semiconductor films having large crystallite textures. The process has been found to be particularly useful in the formation of compound semiconductor films where one of the components is a high vapor pressure element and the substrate material is amorphous.

6 Claims, 5 Drawing Figures

Blue Exciton Luminescence

Fig. 4b.

Green Edge Luminescence

Fig. 5.

PROCESS FOR LOW TEMPERATURE STOICHIOMETRIC RECRYSTALLIZATION OF COMPOUND SEMICONDUCTOR FILMS

RELATED APPLICATIONS

This application is a continuation in part of U.S. application Ser. No. 563,890, filed Mar. 31, 1975 now abandoned, by the Applicants herein.

BACKGROUND OF THE INVENTION

1. Field of the Invention

This invention is directed to the fabrication of compound semiconductor films in general. More particularly, it relates to the formation of CdS compound semiconductor films.

2. Prior Art

Compound semiconductor films are employed in the design and fabrication of photoconductors, light activated display devices, solar cells and thin film transistors. Typical materials found to be useful in such applications are formed from Group II–VI and Group III–V compounds.

It is recognized that considerable advantages, with respect to photoelectric characteristics, are obtained by the fabrication of compound semiconductor films having larger crystallite textures. Such crystalline structures on amorphous substrates are usually obtained by a recrystallization process.

Prior art recrystallization processes may be characterized as involving Microzone recrystallization from the melt (1.) and recrystallization with a metal flux (2.). The former process (1.) is exemplified by A. R. Billing, J. Vac. Sci. Technol. 6, 757 (1969). This process has been employed with InSb and is considered limited to lower melting point compounds having comparable vapor pressure components. It has the added disadvantage of requiring a cover film to preclude droplet formation. The temperature and vapor pressure considerations, critical to the melt process, limit the design flexibility of devices fabricated via this process in that many compounds are excluded. Typical excluded compounds are CdS, CdSe, GaAs, GsP, InAs, and InP.

The latter process (2.) disclosed by Gilles, Van Cakenberghe et al has been extensively studied in connection with CdS. The recrystallization techniques of Gilles and Van Cakenberghe, (J. Gilles and J. Van Cakenberghe, Nature 182, 862 (1958)) and Vecht and Apling, (A. Vecht and A. Apling, Phys. Stat. Sol. 3, 1238 (1963)) allow the formation of rather large monocrystalline regions within such evaporated films. However, these techniques suffer from two distinct disadvantages. First, the films are automatically doped strongly with Ag or Cu and, second Cu and Ag segregation on intercrystalline grain boundaries is difficult to avoid, (R. Addiss, U.S. Government Technical Rept. ASD-61-11 (1962)).

In 1972, Herinckx, et al., (C. Herinckx, W. DeSutter, A. Fourdeux, and N-Terao, Phys. Stat. Sol. (a) 10,387 (1972)) reported recrystallization of CdS films with as little as 40 ppm Ag dopant concentration. This would tend to minimize the second problem. Nevertheless, such films are still strongly doped. Recently recrystallization in CdS films has been observed without the use of Ag or Cu (W. Kahle and H. Berger, Phys. Stat. Sol. (a) 2, 717 (1970)); instead, temperatures in excess of 700° C were employed to achieve the recrystallization. The recrystallization temperature of 700° C for CdS films is greater than that required by the process disclosed by Applicants for the same type of initial CdS film.

SUMMARY OF THE INVENTION

A process for low temperature recrystallization of compound semiconductor films has been developed which utilizes vapor phase controlled stoichiometry. Generally, compounds of the class MX may be recrystallized on an amorphous substrate where M = metals from Group II or III and X = high vapor pressure elements from Group V or IV.

A semiconductor compound of the general formula MX is deposited onto an amorphous substrate by vacuum evaporation techniques (*Handbook of Thin Film Technology* Ed. by L. I. Maissel et al (1970) McGraw-Hill, Inc. Ch 1). The substrate-thin film combination is then placed into a reaction chamber where the temperature is increased to an appropriate recrystallization temperature in an inert atmosphere. The desired gaseous mixture of hydrogen, and X component hydride ($XH_n$) is then introduced to establish a vapor pressure ratio such that the stoichiometry of the film is maintained or induced at that temperature. This condition is maintained until recrystallization occurs at which time an inert atmosphere is reintroduced and the sample is allowed to cool.

This process has the distinct advantage of allowing recrystallization at lower temperatures and facilitating the recrystallization of many compounds not recrystallizable by prior art methods because of the vapor phase control of stoichiometry, i.e., the loss of the higher vapor phase component is inhibited by the presence of the X component hydride. The lack of a necessity for metallic doping, as required by the Gilles and Cakenberghe type processes, is another significant advantage.

When compared to CdS films prepared by the Gilles-Van Cakenberghe process, CdS compound semiconductor devices prepared via this process exhibit faster photoconductor response times. Similarly, films prepared by the presently disclosed process have lower leakage currents when incorporated in photoelectric heterojunction devices via the absence of metallic segregation of intercrystalline grain boundaries.

When CdS films recrystallized by the present process are compared to thermally evaporated non-recrystallized films, the increased grain size offers distinct device advantages. Thus, in CdS based solar cells, large grain size can lead to improved open circuit voltages and short circuit currents, and thus higher energy conversion efficiencies.

DETAILED DESCRIPTION

1. Introduction and Theory

Since the electrical and optical properties of thermally evaporated compound semiconductor thin films deposited on amorphous substrates differ considerably from those of single crystals, recrystallized compound semiconductor films with enlarged monocrystalline regions are often desirable.

Compounds having the general formula MX where M is a metal from Group II or III and X is a high vapor pressure element from Group V or VI have been found useful in the fabrication of various devices employing compound semiconductor films.

State of the art processes for preparing such films generally consists of a vacuum thermal evaporation technique followed by a heat treatment of some type to improve their characteristics. For example, freshly evaporated CdS films are generally Cd rich, highly conductive, and light insensitive. For photoconductor applications, it is thus customary to heat treat evaporated CdS films in some fashion in order to improve stoichiometry, raise resistivity, and improve light sensitivity. Furthermore, freshly evaporated CdS films on non-crystalline substrates are generally amorphous or polycrystalline with crystallite sizes less than 1 μ. The concurrent inter-crystalline boundaries cause low carrier mobilities, carrier trapping, and carrier recombination. Thus, it is desirable to produce recrystallization during the subsequent heat treatment.

Prior art processes are limited in that either high temperatures are required, metallic doping is necessary, or a cover layer is required to preclude droplet formation.

Specifically for CdS films, we have found an $H_2S$ heat treat process which produces recrystallized films with controllable crystallite sizes ranging from 5 μ to 800 μ. Such films have high dark resistivity, high light sensitivity, high mobility, and low impurity content. Generally, MX films may be recrystallized by this process at lower temperatures without the need for impurity doping. The method involves an $XH_n$ thermal process whereby the excess M in the deposited film is compensated by oxidizer X in a chemical reaction. Lower recrystallization temperatures are attributable to increased stoichiometry. As a consequence of lowering the temperatures of the process, recrystallization on a larger variety of substrate materials is possible. Specifically for CdS films, this includes Indium Tin Oxide (ITO) coated soda-lime glass of the type used in photoactivated displays. In this case, the ITO derives from tin doped $In_2O_3$. The tin doping is approximately 10% by weight when compared to the indium content. See "David B. Fraser" proceedings of the Institute of Electrical and Electronic Engineering, 61 1013 (1973). Soda-Lime glass has an expansion coefficient compatible with that of CdS. Thus the undesirable crazing observed after heating CdS films deposited on borosilicate glass (pyrex) or fused silica can be avoided.

The recrystallization temperature of compound semiconductor films is a function of film stoichiometry. This temperature is lowered as the film stoichiometry is improved. As MX compounds are heated, the stoichiometry tends to degrade by loss of the volatile high vapor pressure X component.

This dissociation problem can be alleviated by controlling the X component vapor pressure by a second gas phase reaction involving $XH_n$ and $H_2$. Two examples where N is 2 and 3 are:

$$2CdS \rightarrow 2Cd + S_2 \qquad (1)$$

$$2H_2S \rightarrow 2H_2 + S_2$$

$$2InP \rightarrow 2In + P_2 \qquad (1)$$

$$2PH_3 \rightarrow P_2 + 3H_2$$

In the CdS case, if $H_2$ and $H_2S$ are introduced into a reaction tube with CdS in the right proportion, the $S_2$ vapor pressure can be pinned at the value necessary to yield stoichiometric CdS.

The $p[H_2S]/p[H_2]$ ratio for the second reaction defines the $p[S_2]$ ratio for the first reaction. The result is that sulfur loss in the CdS film is inhibited, stoichiometry is maintained or induced, and recrystallization occurs at a lower temperature than would be possible without the vapor phase controlled stoichiometry.

Considering further the specific case of CdS, two observations relating to the heat treat recrystallization process need to be noted. First, the recrystallization occurs at temperatures below 525° C without the use of a Cu or Ag flux. The only other reported CdS film recrystallization without the use of the flux ("inner chamber" evaporated CdS films heat treated at 700° C in closed gas filled quartz ampoules) (see Kahle and Berger supra) occurred at temperatures approximately 200° C higher. Second, the $H_2S$ flow rate in the reaction chamber has a pronounced effect on the speed and temperature of recrystallization.

With respect to the low recrystallization temperature in the pesent CdS case without the use of the heavy metal flux, there are two indications that excess Cd acting as a donor in the film impedes the recrystallization. First, Addis, (Tenth National Symposium on Vacuum Technology Transactions, 1963 (Pergamon Press, 1963)) states that "recrystallization of CdS films (even with heavy metal flux) is not observed until the CdS is deposited in an enclosed chamber." The effect of the enclosed chamber is to produce as-deposited films with higher stoichiometry due to the reduction of sulfur vapor loss; then the additional compensation necessaryto initiate recrystallization in the temperature range of 400° to 600° C is provided by the acceptor nature of the silver or copper. As the heat treat temperature is raised, the quantity of heavy metal necessary for recrystallization is reduced and becomes unnecessary at 700° C.

Figure 3:
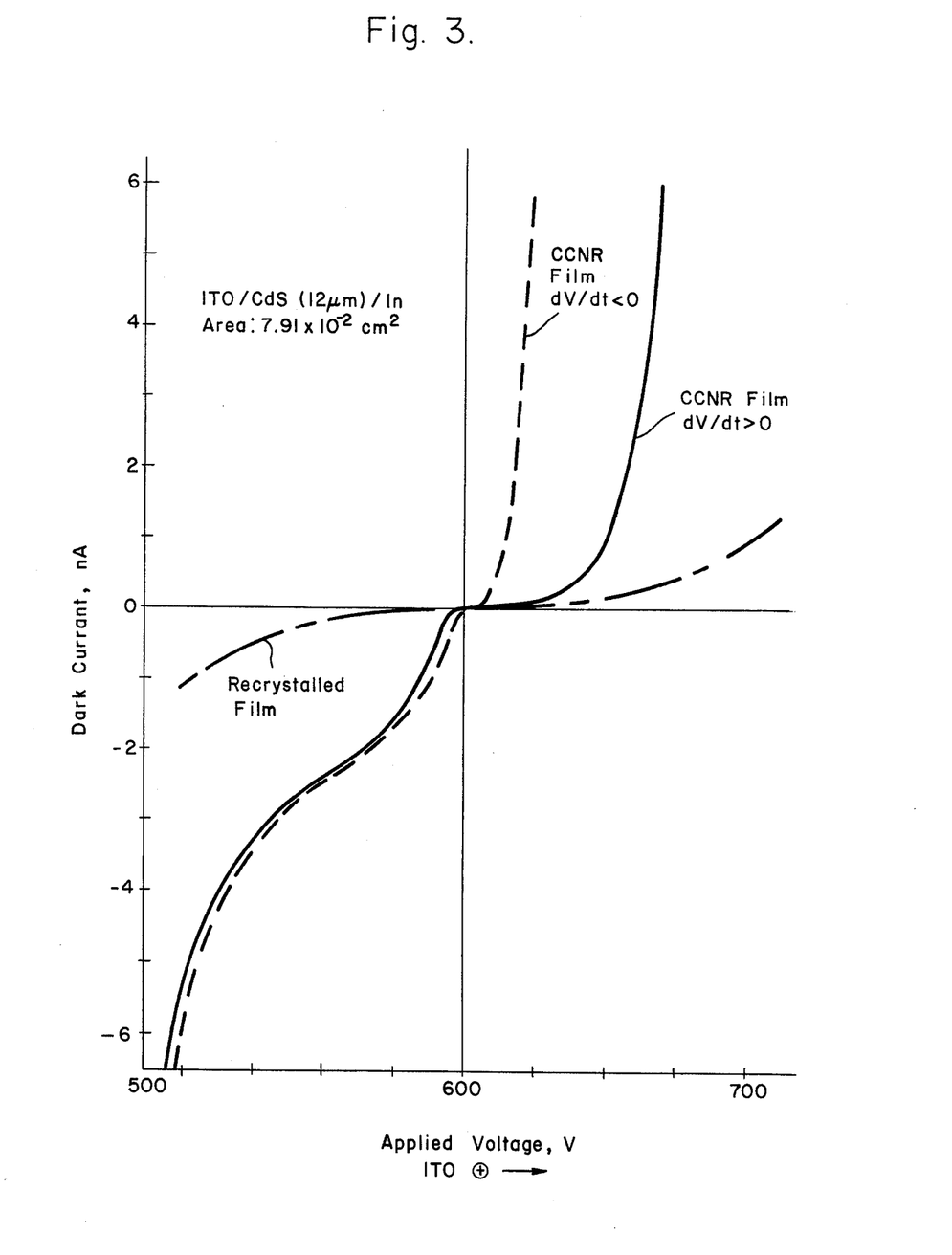
In FIG. 3, roon temperature dark I versus V curves are shown for a Cd compensated nonrecrystallized film and a recrystallized film. The data were taken after the samples had been cycled between ±10 V continuously for 24 hours in the dark. The sweep rate used was $dv/dt$ = 20 mV/sec. The curves were recorded with a Keithley 602 electrometer.

A second indication of the necessary compensation of excess Cd before recrystallization can occur can be seen by a comparison of the Cd compensated nonrecrystallized (CCNR) films with the recrystallized films. In the CCNR films, the H$_2$S thermal processing is stopped before the sulfur compensation of the films is complete. Assuming that the reaction proceeds from the top surface of the film toward the substrate, in the CCNR films we would expect more excess Cd at the substrate interface than at the outer face. (It appears that the recrystallization starts when the film is compensated through to the substrate at which point nucleation on interface material occurs with the ensuant lateral crystallite growth. (W. Kahle and H. Berger, (supra).) Then the CCNR films should show an electrical asymmetry indicative of the excess Cd near the substrate interface. This asymmetry can be seen in the I-V curves of FIG. 3. While the recrystallized films have a symmetrical I-V structure, the I-V curves for the CCNR films in the ±0.5 V range is representative of a diode. This diode behavior cannot be explained by the differences in the In and ITO contacts because the same contacts on the recrystallized films give ohmic behavior. On the other hand, this diode characteristic can be explained by the Cd excess asymmetry in the film just discussed. Under this conditions, one would observe an n$^+$n I versus V diode characteristic corresponding to the junction between the layer with excess cadmium and that which is sulfur compensated. This is observed in FIG. 3 for the CCNR film under low voltage conditions. With this junction in diode back bias condition (ITO + ; N$^+$ region biased positively), a saturation current is observed. In the opposite (diode forward bias) condition, the current rises sharply. At higher voltage the contact injection becomes predominant.

Thus, on the basis of the expected recrystallization process and the electrical behavior of films that are processed so that recrystallization does not occur, it is plausible to assume that a requirement for the low temperature recrystallization is a high degree of stoichiometry in the film, particularly near the substrate interface.

The idea that nucleation for recrystallization occurs in the interface region is supported by our experimental observation that the final crystallite size can be varied from approximately 5 μ to approximately 30 μ by varying the substrate temperature from one evaporation run to the next from 90° C to 130° C. Presumably, the lower substrate temperature provides more nucleation sites via more CdS interface crystallites deviating from the c-axis oriented texture of these films.

In addition to the elimination of excess Cd, the flow rate of H$_2$S through the reaction chamber is important in lowering the recrystallization temperature. As can be seen by reference to Table I, recrystallization of a film can be initiated by increasing the flow rate of H$_2$S through the reaction chamber by an order of magnitude while using temperature and time conditions that will not produce recrystallization with the lower flow rate. An additional observation is that with high flow rates, there is no sulfur deposited on the cold downstream portion of the reaction tube. A sulfur deposit is always observed under low flow conditions indicating a decomposition of the H$_2$S.

These observations can be explained by a consideration of the composition of the gas flowing through the reaction chamber. Under high flow conditions the decomposition of H$_2$S into S$_2$ and H$_2$ is suppressed. Under true equilibrium conditions in this temperature range, the sulfur vapor partial pressure can be raised from $3 \times 10^{-3}$ atm to $2 \times 10^{-2}$ atm with a change in temperature from 400° C to 500° C. (Kirk-Othmer, Encyc. of Chem. Tech. (Interscience) 19, 376.) Thus conceivably, under high flow the CdS films react directly with H$_2$S and recrystallize, while under low flow conditions, the films react additionally with S$_2$ which inhibits recrystallization.

Kahle and Berger (supra) note that films heat treated in sealed ampoules with S$_2$ over pressure do not recrystallize. We have observed that films heat treated in a sealed reaction tube with equal pressures (atomic numbers) of H$_2$S and hydrogen gas in a mixture (PH$_2$S/PH$_2$=1) repeatedly recrystallize at 525° C. (The H$_2$ suppresses the sulfur vapor pressure to nearly its equilibrium value (P[S$_2$] = $10^{-7}$ atm) for stoichiometric CdS at 500° C.) These facts are consistent with the interpretation that reaction with S$_2$ inhibits recrystallization in the low flow case. The conclusion is, then, that the experimental evidence for CdS films just reported shows that vapor phase controlled stoichiometry reduces the recrystallization temperature and facilitates recrystallization of MX compound films. This has not been incorporated in prior art recrystallization processes.

2. Properties of CdS Films Prepared by Inventive Process

The data of Table I show a subdivision between two distinct types of films. The first type is represented in its complete form by the low flow rate, 475° C, 30 min. heat treat. These films are photosensitive, orange, and highly resistive. As verified in scanning electron microscope photographs, these films show the c-axis oriented columnar crystallite morphology of as-deposited CdS films. (F. Shallcross, RCA Rev. 28, 569 (1967). In these as deposited films, the c-axis orientation is normal to substrate plane.) Apparently, in these films the H$_2$S has reacted with the excess Cd (Cd compensated) to the extent that the films are highly resistive, but as yet, not to the point of recrystallization. For the purpose of this discussion, these films are referred to as Cd compensated nonrecrystallized films (CCNR films).

Figure 1:
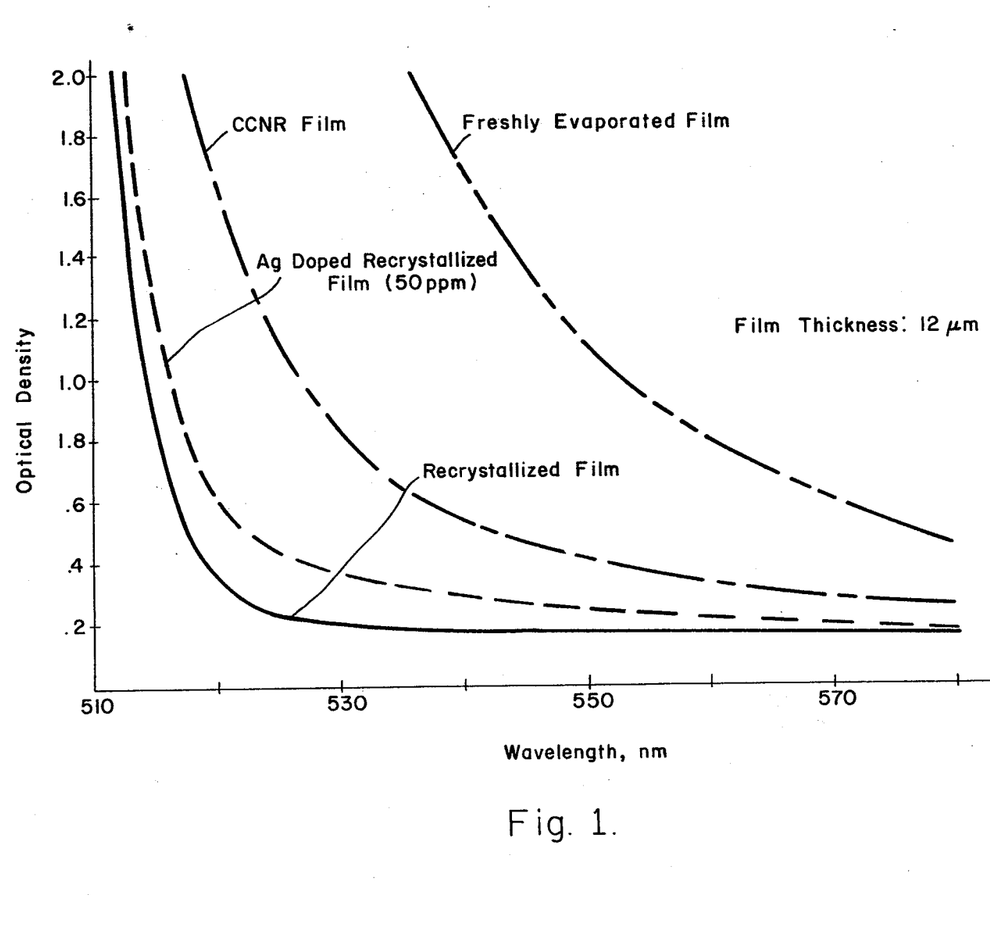
FIG. 1 presents room temperature optical absorption spectra for various 12$\mu$ CdS films.
Figure 2:
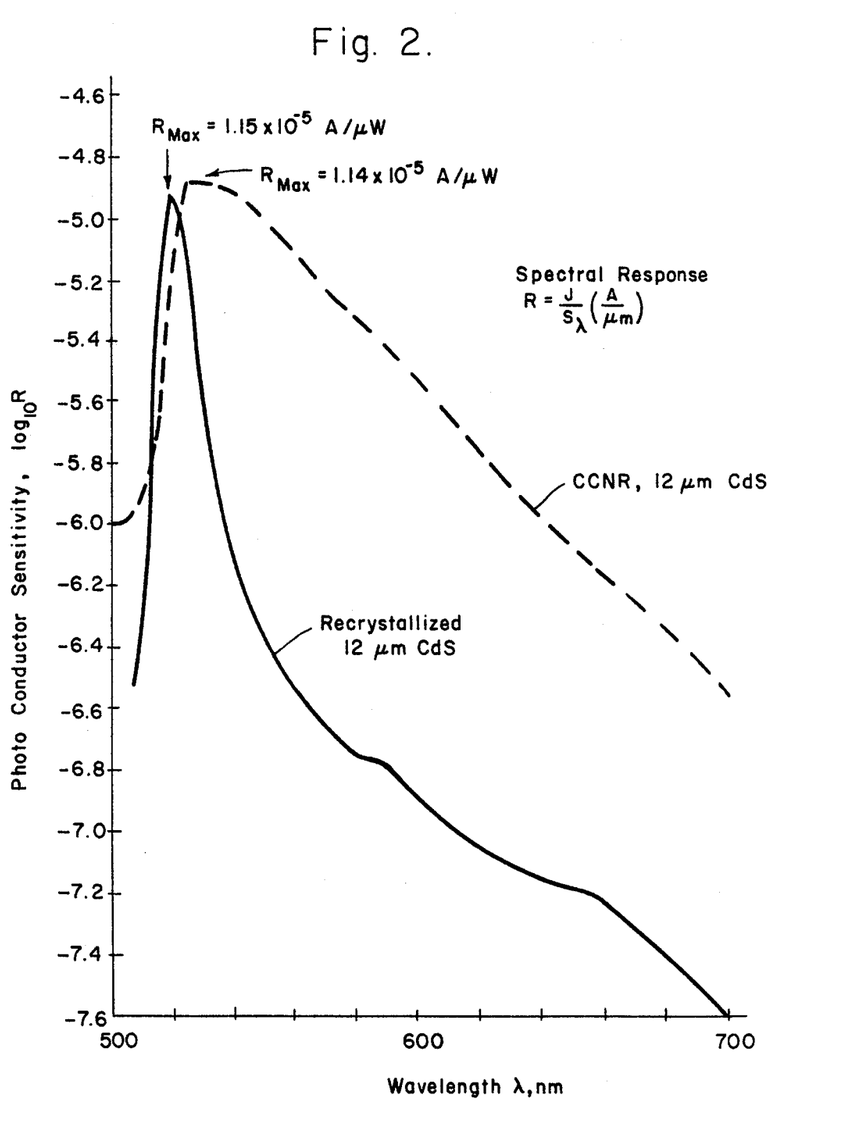
In FIG. 2, the D-C photoconductor response spectra are plotted for a 12$\mu$ thick Cd compensated noncrystallized film and a 12$\mu$ thick recrystallized film. The data were taken at room temperature with current flowing perpendicular to the film plane, light illumination through an indium tin oxide (ITO) transparent electrode, and 1.35 V applied voltage with the ITO electrode positive with respect to an indium contact.
Figure 4A:
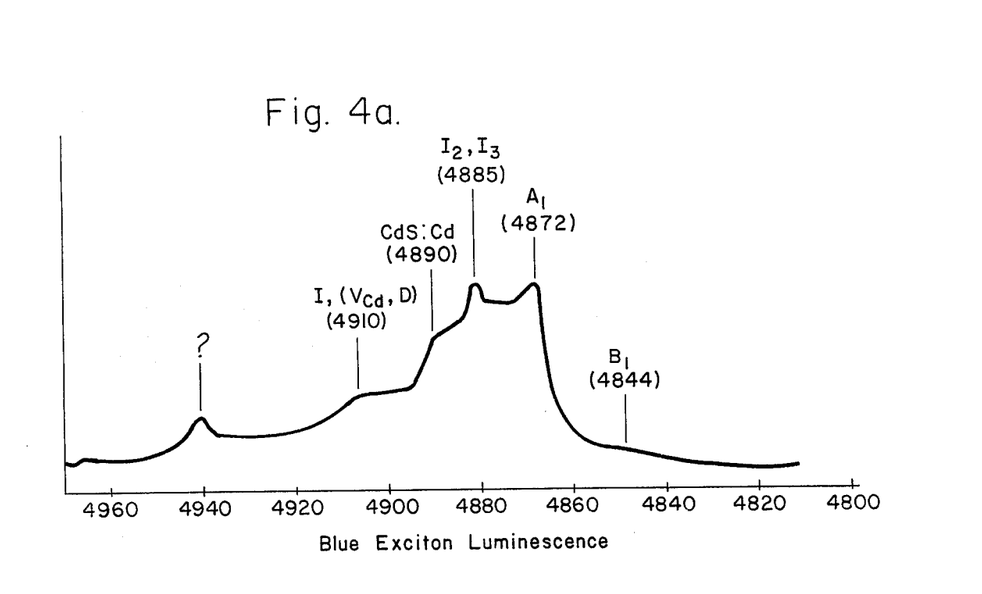
In FIG. 4, low temperature photoluminescence spectra are presented for a 12μ recrystallized CdS film. The film was immersed in liquid nitrogen and excited at the top surface with 4579A Ar ion laser light. The spectrum of (a) is similar to the single crystal exciton spectrum except for small peak position shifts (∼ 5 A) possibly resulting from strains in the film via the soft glass substrate thermal expansion coefficient mismatch. The spectrum of (b) is the typical green edge luminescence spectrum from Na impurities generally found in CdS. No red luminescence from Cu or Ag is observed.
Figure 4B:
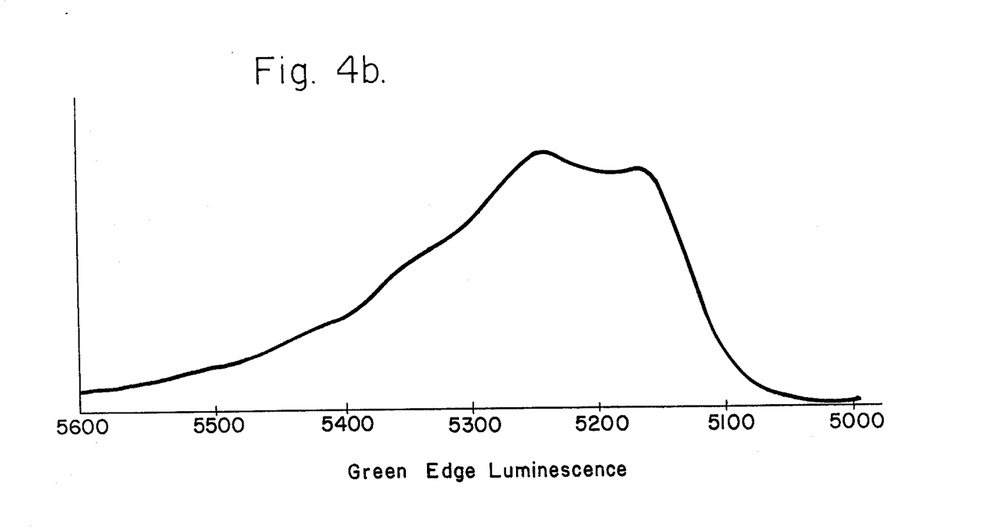

The second type of film relevant to the recrystallization of this application is represented in its complete form by the heat treat at 525° C for 40 min. at a high H$_2$S flow rate. These films are yellow, highly resistive, photosensitive recrystallized films. When viewed in a polarizing microscope, these films show the morphology described by Kahle and Berger (supra). The c axis is no longer perpendicular to the substrate and columns with less than 1 μm diameter no longer exist. Instead, a crystal matrix with an average crystallite size of 30 μm is easily visible in the polarizing microscope. Representative optical absorption spectra, photoconductive spectra, and I versus V curves for these two types of films are found in FIGS. 1, 2, and 3, respectively. The data presented in these figures show that the recrystallized CdS film properties tend to approximate more closely the properties of single crystals than is generally found with microcrystalline CdS films. The 77°K blue exciton spectrum, (Ermolovich, Lynbchenko, and Sheinkman, Sov. Phys. Semicond, 2, 1364 (1969)), (S. Ibuki and A. Ohso, J. Phys. Chem. Solids 27, 1753 (1966).), shown in FIG. 4 for a recrystallized film gives firm support to this conclusion. In fact, excitons are not generally found in microcrystalline films and the occurrence of such excitons in recrystalline films indicates that defect densities are low. It is clear from the photo-response of FIG. 2 and the hysteresis of FIG. 3 (CCNR curves) that the nonrecrystallized films have somewhat higher trap densities than recrystallized films. By measuring the rise time of photocurrents and the saturation photocurrent light intensity, an estimate of 1 to 3 × $10^{17}/cm^3$ was made for the slow (i.e., deep) trap density in these recrystallized films. This number is compatible with the reported elsewhere, (J. Dressner and F. Shallcross, J. Appl. Phys. 34, 2390 (1963)) for Ag treated recrystallized films. However, the fact that we recrystallize films on sapphire (no substrate doping) and that intentionally Ag doped (50 ppm) recrystallized films are more orange (FIG. 1), indicates that trace Ag impurities do not play a role in our recrystallization process. This conclusion is further supported by the observation of prominent green edge luminescence in both recrystallized films (FIG. 4b) and the CdS starting material, (supra). No red luminescence is seen in either material, (Van Gool, W. Fluorescence and Photoconduction in Silver-Activated Cadmium Sulfide.Philips Research Reports, V. 13, 1958, p. 157–166). As was observed with Ag doped films, our recrystallized films show IR (8500A) quenched phtoconductivity. However, such quenching has also been observed in non Ag doped single crystals, (R. Bube and L. Barton, RCA Rev. 20, 564 (1959)).

CdS PREFERRED EMBODIMENT EXAMPLES

A. Preparation of Films for Recrystallization

The films studied here were all vacuum evaporated in the same way. The evaporation system used allows baffled cold trap operation to vacuums better than $10^{-6}$ Torr. The CdS starting material (Eagle-Pitcher ultra high purity crystal chips) contains less than 1 ppm spectroscopically measurable impurity. The CdS is thermally evaporated from a baffled tantalum boat at an optically monitored rate of 8 A/sec. The substrates are cleaned in an oxygen glow discharge before each deposition and the substrate temperature is monitored and held at 130° C during the evaporation.

The films after evaporation have an orange-yellow color and resistivities of approximately $10^3$ Ω-cm indicating an excess of Cd. (R. Ludeke, J. Vac. Sci. Tech. 8, 199 (1971).) In this work, a heated inner chamber in the bell jar is not used.

Films have been prepared in a variety of thicknesses (4, 12, and 16 μm) and on a variety of subtrate materials such as:
1. Soda-lime glass
2. Soda-lime glass overcoated with ITO
3. Sapphire
4. Pyrex
5. Fused silica
6. Cu doped glass (Corning No. 4303)
7. Soda-lime glass coated with 7 A of Ag.

These substrate variations have allowed us to conclude that Ag and Cu impurities are not necessary for the recrystallization reported here.

Figure 5:
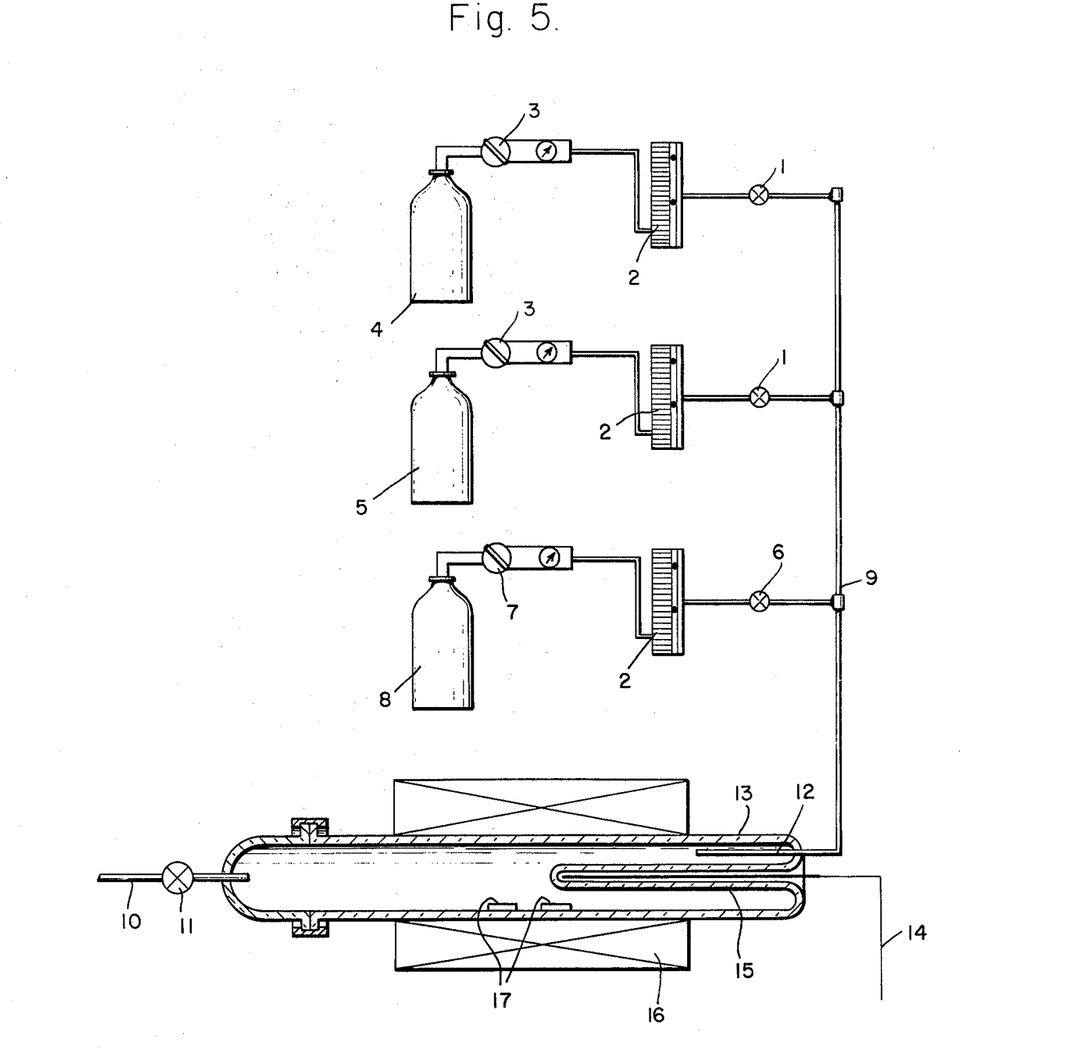
FIG. 5 is a schematic of a typical Hydrogen-Hydrogen Sulfide recrystallization furnance for CdS films.

B. Heat Treat Recrystallization (1) Flowing $H_2S$ System: Referring to FIG. 5, a method for using the process is described. Films 17, prepared by the method described above, are placed in a quartz furnace tube 13 and brought to temperature in flowing inert gas (either Nitrogen or Argon). The gas is contained in a bottle 4 connected to the quartz tube 13 by a series of control valves 1, 3 and a flow meter 2 which are used to control the flow rates of gas.

At temperature, (approximately 525° C), chemical purity grade $H_2S$ is switched into the furnace tube 13 and allowed to flow through the chamber at 500 standard cubic centimeters per minute (st ccs/min) for from 30 to 50 minutes.

In order to preclude erosion of the apparatus exposed to $H_2S$ gases, stainless steel components are employed in control valves 6, 11, the regulator valve 7 and the system inlet and outlet lines 9 and 10.

The temperature of the quartz tube furnace 16 is monitored by a thermocouple 14 inserted into a quartz thermocouple tube 15.

After heat treat, the films are cooled relatively rapidly (30 minutes) to room temperature again in an atmosphere of flowing nitrogen.

CdS films treated by this process are completely recrystallized and exhibit a yellow crystalline structure ranging from 50 to 30 μ.

2. Static $H_2S$ System: A second process for heat treating CdS films involves placing the CdS coated substrate into the reaction chamber, bringing the sample to temperature as above and introducing a 50 atomic % $H_2S$ (8) - 50 atomic % $H_2$ (5) mixture into the chamber which is then sealed and maintained at temperature for approximately 40 minutes.

After treatment, cooling may be accomplished as described above.

3. Static $H_2S$ System With Moving Zone: A third method of treating CdS films utilizes a static 50 atomic % $H_2S$ - 50 atomic % $H_2$ mixture to blanket the substrate heated to approximately 440° C (just below the recrystallization temperature). Then a laser beam or other light source may be focused by a cylindrical lens along a line, say 50 μ by 1 mm in area with enough energy to heat that zone to 525° C. As the zone is heated, recrystallization will occur and multiple nucleation will be avoided. The zone is slowly moved across the sample by scanning the laser or other light source beam.

After treatment, cooling is again accomplished via the process described for the flowing $H_2S$ system.

The parameters indicated in the above processes can be varied consistent with the particular recrystallization objective. While the examples disclose the process as applied to CdS films, other MX films such as CdSe, GaAs, GaP, InAs, and InP may be used.

The initial film preparation should be effected by evaporation onto an elevated temperature substrate in order to achieve as nearly as possible, in evaporation, good stoichiometric films.

Having fully described our invention and disclosed its relative advantages over prior art processes, our claims may be readily understood.

What we claim is:
1. A vapor phase controlled processing method for producing recrystallized MX films with improved photoelectric properties where M is a metal taken from Group II or III Of the periodic table and X is a high vapor pressure element taken from Group V or VI of the periodic table comprising the steps of:
 (a) depositing an MX compound onto an amorphous substrate taken from the group comprised of soda-lime glass, soda-lime glass overcoated with ITO, sapphire, borosilicate glass, and fused silica via physical vapor deposition to form a thin film;
 (b) placing said film into a reaction chamber equipped with a means for introducing alternatively an inert and reactive gaseous atmosphere;
 (c) raising the temperature of said film in said chamber to its recrystallization temperatures while purging said chamber with an inert gas;

(d) passing a reactive atmosphere of $XH_n$ where $n$ may be 2 or 3 and $H_2$ through said chamber whereby a vapor pressure ratio is induced and maintained at the MX compound stoichiometric level while maintaining said recrystallization temperature over a period ranging from 5 to 50 minutes; and (e) subsequently cooling said film by reintroducing an inert gas until the temperature of said film has returned to room temperature.

2. The process of claim 1 wherein MX is CdS, and said substrate is taken from the group comprised of soda-lime glass, soda-lime glass overcoated with ITO, sapphire, borosilicate glass, fused silica, Cu-doped glass and soda-lime glass coated with up to 7 Angstroms of vapor deposited Ag to form a thin film.

3. The process of claim 1 wherein MX is CdS, said amorphous substrate is soda-lime glass overcoated with Indium Tin Oxide and said reactive gas is $H_2S$ mixed with $H_2$.

4. The process of claim 1 wherein the flow rate of said reactive gas is 500 standard cubic centimeters/min., MX is CdS and said substrate is soda-lime glass coated with ITO.

5. The process of claim 1 for CdS wherein said reactive gas mixture is 50 atomic % $H_2$, 50 atomic % $H_2S$ in a static system, said recrystallization temperature is 525° C – 550° C, said reaction time is from 10 to 50 min., and said substrate is ITO coated glass.

6. The process of claim 5 wherein a hot traveling zone is used to induce recrystallization.

* * * * *